United States Patent [19]

McArthur

[11] Patent Number: 5,554,884

[45] Date of Patent: Sep. 10, 1996

[54] MULTILEVEL METALLIZATION PROCESS FOR USE IN FABRICATING MICROELECTRONIC DEVICES

[75] Inventor: Warren F. McArthur, Solana Beach, Calif.

[73] Assignee: Hughes Aircraft Company, Los Angeles, Calif.

[21] Appl. No.: 378,995

[22] Filed: Jan. 27, 1995

Related U.S. Application Data

[63] Continuation of Ser. No. 134,120, Oct. 7, 1993, abandoned.

[51] Int. Cl.⁶ .................................................. H01L 23/58
[52] U.S. Cl. .................... 257/634; 257/635; 257/637; 257/644; 257/650; 437/189; 437/195; 437/235; 437/982
[58] Field of Search .................................. 437/195, 189, 437/235, 982; 257/634, 635, 637, 644, 650

[56] References Cited

U.S. PATENT DOCUMENTS

| | | | |
|---|---|---|---|
| 4,662,064 | 5/1987 | Hsa et al. | 437/195 |
| 4,686,000 | 8/1987 | Heath | 156/643 |
| 4,900,690 | 2/1990 | Tamura | 437/195 |
| 5,114,530 | 5/1992 | Rao et al. | 437/235 |
| 5,143,820 | 9/1992 | Kotecha et al. | 430/314 |

OTHER PUBLICATIONS

Stanley Wolf, "Silicon Processing for the VLSI Era; vol. 2: Process Integration", Lattice Press, (1990), pp. 212–214 and p. 288.

Primary Examiner—D. J. Carroll
Attorney, Agent, or Firm—M. E. Lachman; M. W. Sales; W. K. Denson-Low

[57] ABSTRACT

A multilevel metallization is deposited on a microelectronic device base structure (40). The process includes depositing a glassy dielectric layer (48) of a thickness that is from about two to about three times as thick as the topography thickness (D) of the base structure (40). The glassy dielectric layer (48) is heated to a temperature above its glass transition temperature to flow the glassy dielectric layer (48). The glassy dielectric layer (48) is thinned to a preselected thickness, and a first patterned metallization layer (54) is deposited. The process further includes depositing an interlevel dielectric layer (58), dry etching the interlevel dielectric layer (58) to thin the interlevel dielectric layer (58) and, optionally, depositing additional interlevel dielectric layer (58') material to achieve a preselected thickness. A second patterned metallization layer (64) is deposited over the interlevel dielectric layer (58/58').

12 Claims, 2 Drawing Sheets

MULTILEVEL METALLIZATION PROCESS FOR USE IN FABRICATING MICROELECTRONIC DEVICES

This is a continuation of application Ser. No. 08/134,120 filed Oct. 7, 1993 abandoned.

BACKGROUND OF THE INVENTION

This invention relates to the fabrication of microelectronic devices, and, more particularly, to the preparation of multilevel metallizations in such devices.

Thin-film microelectronic devices are typically prepared as a succession of overlying layers of metals, semiconductors, insulators, and possibly other materials. The various layers are deposited, patterned, and etched to form specific active or passive circuit elements, interconnections, insulations, etc. This technology has the important advantage that the microelectronic device may be made very small, and that thousands of circuit elements can be fabricated in a single integrated unit.

Individual layers and circuit elements often have dimensions in the range of a micrometer or less. With this fine scale and in view of the many layers and circuit elements that may be present, great care is required to avoid manufacturing defects. For example, the deposition of unwanted material, the removal of necessary material, or the introduction of contamination at a single location can lead to inoperability of the final product.

In one phase of thin-film microelectronic device fabrication, it is often necessary to deposit multiple patterned layers of electrically conductive metals overlying some active semiconductor circuit components. The metallization is usually provided to electrically interconnect different active elements as required by the overall device design. Because of the complexity of some of the circuit designs, a single level of metallization cannot satisfy the interconnection requirements. Multiple, three dimensionally interconnected metal layers are therefore sometimes required.

A layer of metal must be deposited onto a generally smooth, planar surface. Some degree of irregularity of the underlying surface is acceptable, but if the surface is too irregular the continuity of the metal may be lost or other defects may result. When a multilevel metallization is required, the first (bottom) layer is typically patterned into a series of planar leads, termed traces. These traces naturally constitute a surface irregularity for the deposition of succeeding layers. An insulator layer is usually applied over the first metal layer, but the insulator layer will have an irregular surface due to the underlying traces, unless care is taken to attain a planar surface.

Techniques are known for producing a more planar surface upon which the succeeding metallization may be deposited. One approach is a photoresist etchback procedure wherein a photoresist is deposited onto the surface, flowed, and etched back in a dry plasma etcher. Another approach is a spin-on technique in which a glassy insulator precursor is placed onto the irregular surface and spun while flowable to cause its upper surface to become more planar. The precursor is then heated to drive off solvent and form a glass insulator. Unfortunately, both of these approaches have drawbacks. Photoresist etchback depends upon the ability to co-etch different materials at the same rate, and that is difficult to achieve in practice. In practice, there is observed a high defect density in the final product. Both of these techniques are also relatively prone to introducing particulate and other contamination into the surface of the device. The contamination may be retained into the final device and adversely affect its electrical performance.

There is a need for an improved technique for fabricating multilevel metallizations in microelectronic devices. The present invention fulfills this need, and further provides related advantages.

SUMMARY OF THE INVENTION

The present invention provides a multilevel metallization process for use in the fabrication of microelectronic devices and devices made by that process. The technique is successful in producing high-quality multilevel metallizations. It does not require the uniform co-etching of different materials or introduce defect structures, nor does it contaminate the microelectronic device, as may be the case for prior approaches for multilevel metallizations. The approach of the invention is implemented with individual process steps that can be practiced using known processing apparatus and practices.

In accordance with the invention, a process for depositing a multilevel metallization in a microelectronic device comprises the steps of providing a microelectronic device base structure, depositing a flowable dielectric layer, flowing the flowable dielectric layer, and etching back the flowable dielectric layer. The process further includes depositing a first patterned metallization layer, depositing an interlevel dielectric layer, etching back the interlevel dielectric layer, and depositing a second patterned metallization layer. Optionally, additional interlevel dielectric layer material may be deposited after the step of etching back.

The flowable dielectric layer is preferably a glass that is heated above its glass transition temperature for flowing. The flowable dielectric layer is deposited in a thickness that is 2–9 times the thickness of the underlying topography of the microelectronic device base structure. The degree of smoothing or planarization of such a thick dielectric layer as a result of the reflowing and etching is much greater than would be obtained with a thin dielectric layer, due to the easier flow and movement in a thicker layer. The etching back of the flowable dielectric layer is preferably accomplished in a blanket fashion, without masking. The entire layer is etched back to the required dielectric layer thickness, and there is no concern with co-etching different materials.

The first patterned metallization is deposited by a conventional combination of masking, deposition, etching, and other steps as required. A layer of interlevel dielectric material such as silicon dioxide is deposited overlying the patterned metallization. This layer is etched back to act as a spacer layer for the underlying metallization, to smooth out sharp features. Additional interlevel dielectric material may be deposited over the etched-back interlevel dielectric material to form a dielectric layer of the required thickness. The second patterned metallization layer is deposited over this dielectric layer.

Additional metallization layers may be deposited overlying this structure by repeating some or all of the above-described process steps.

This technique avoids the need to co-etch different materials and does not introduce an extensive defect structure into the final article. There is no contamination above that of conventional processing, since the etching is preferably a dry plasma etch and carrier solutions are not required. The microelectronic device final product having multilevel metallization produced by this process is therefore superior to that produced by conventional processing. Other features and advantages of the present invention will be apparent from the following more detailed description of the preferred embodiment, taken in conjunction with the accompanying drawings, which illustrate, by way of example, the principles of the invention.

DETAILED DESCRIPTION OF THE INVENTION

Figure 1:
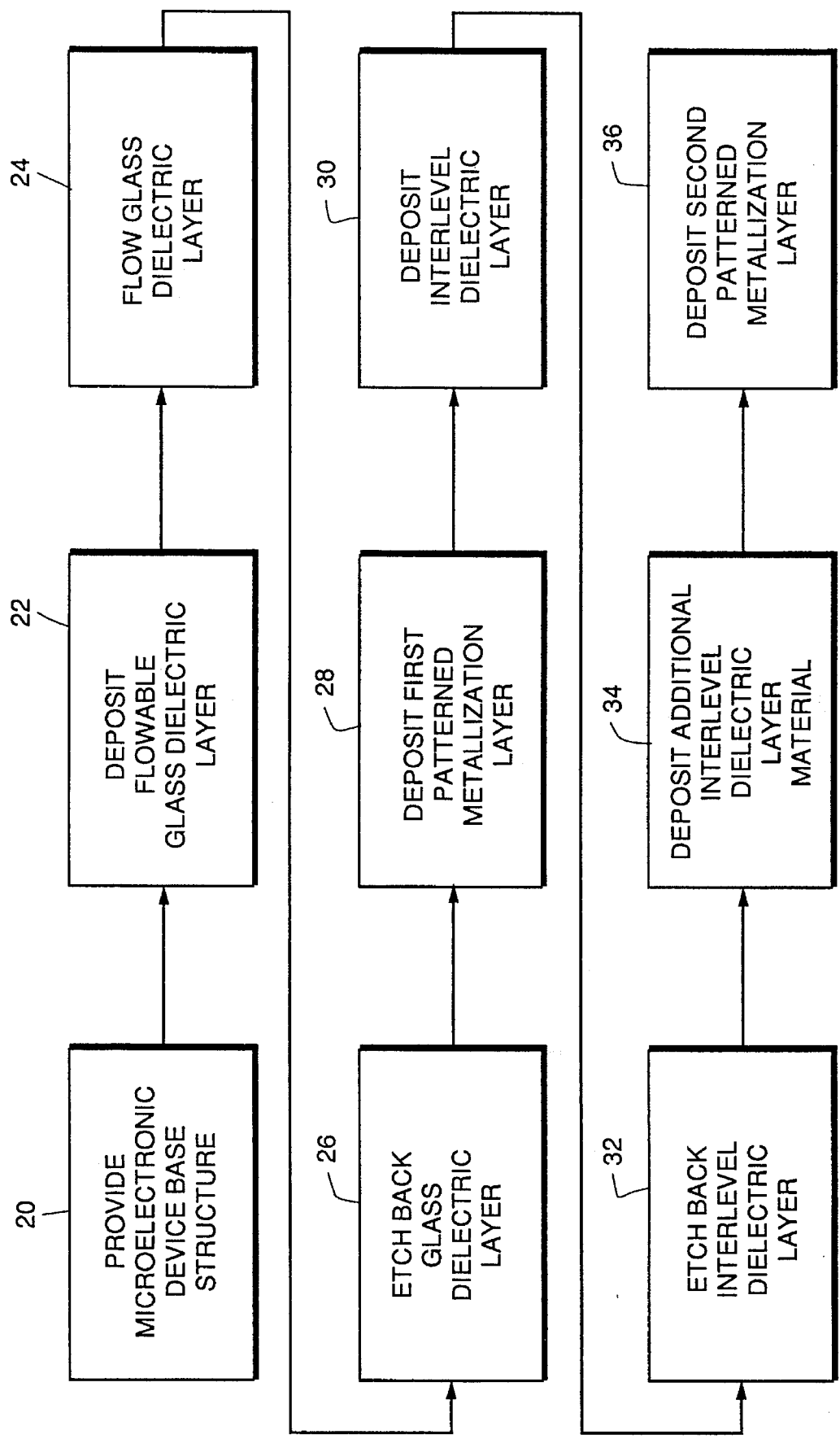
FIG. 1 is a process flow diagram for the approach of the invention.

FIG. 1 is a block flow diagram of the process of the invention. FIG. 2 is a series of schematic views of the microelectronic device at the stages of fabrication shown in FIG. 1. The views of FIG. 2 show the interrelations between features, and are not drawn to scale. The process steps of FIG. 1 will be discussed, with appropriate reference to the structures of FIG. 2.

Figure 2A:
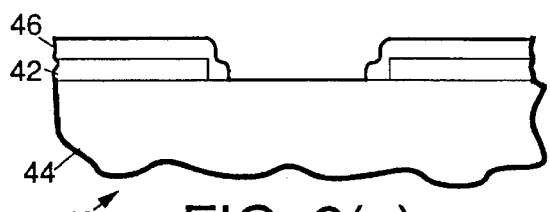
FIG. 2 is a series of schematic sectional views of the microelectronic device structure at the stages of fabrication.

A microelectronic device base structure 40 (FIG. 2(a)) is provided, numeral 20. The microelectronic device base structure 40 is provided to the present process, and may be any base structure requiring a multilevel metallization. In the illustrated base structure 40, there is an electronic element 42 on a substrate 44, and an overlying polysilicon layer 46 to which electrical connection is to be made. The height of the features and layers above the substrate 44, here the thickness of the electronic element 42 and the polysilicon layer 46, is termed the topography thickness D.

Figure 2B:
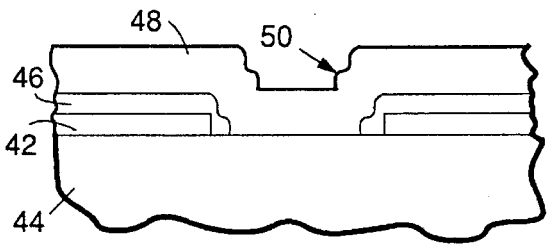

A flowable dielectric layer, here a flowable glass dielectric layer 48 (FIG. 2(b)) is deposited overlying the microelectronic device base structure 40, numeral 22. The layer 48 is a flowable material that can be flowed when heated above its glass transition temperature. A preferred material for the layer 48 is a borophosphosilicate glass (also termed "BPSG"), which has a composition of about 4 weight percent phosphorus, 4 weight percent boron, balance silicon dioxide. BPSG is deposited using conventional chemical vapor deposition techniques.

When a constant thickness of the flowable glass dielectric layer 48 is deposited over the base structure 40 having an uneven surface, the upper surface of the layer 48 also is uneven in a manner that generally follows the underlying surface of the base structure 40, as indicated at numeral 50. This unevenness 50 is not conducive to the deposition of an overlying metallization.

Figure 2C:
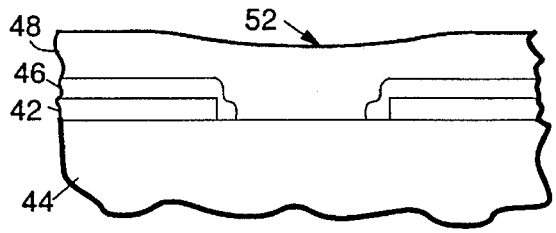

To reduce the magnitude of the unevenness 50 or eliminate it entirely, the material of the layer 48 is flowed by heating it above its glass transition temperature, numeral 24. In the case of BPSG, the glass transition temperature is about 850° C. Heating the assembly above this temperature causes the glassy BPSG material to flow. The flow reduces the magnitude of the unevenness, as shown in FIG. 2(c) at numeral 52. The upper surface of the layer 48 is therefore more nearly planar than when first deposited.

It has been observed by the inventor that when the layer 48 of flowable material is thin, flowing occurs with difficulty or not at all until the assembly is heated to high temperatures. It is believed that there is a constraint on the layer 48 analogous to a boundary effect from its contact with the underlying structure. To ensure that sufficient flow will occur, the thickness of the layer 48 is made about 2–9 times as thick as the topography thickness D. If the layer 48 is less than about 2 times as thick as D, sufficient flow does not occur to planarize the layer 48. If the layer 48 is made thicker than about 3 times D, extra unnecessary material removal is required in the next step. In a typical example, the topography thickness D is about 0.6 micrometers, and the layer 48 is deposited to be about 1.2–1.8 micrometers in thickness.

Figure 2D:
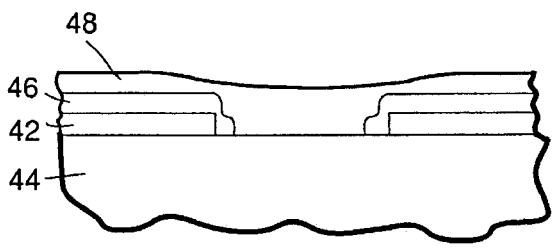

After flow of the layer 48 is complete, the excess thickness of the layer 48 is removed, numeral 26, preferably by a dry etch such as a plasma etch, see FIG. 2(d). The flowed layer at process step 24 is much thicker than desired for via penetration in a later step, and the excess material is removed in process step 26.

Figure 2E:
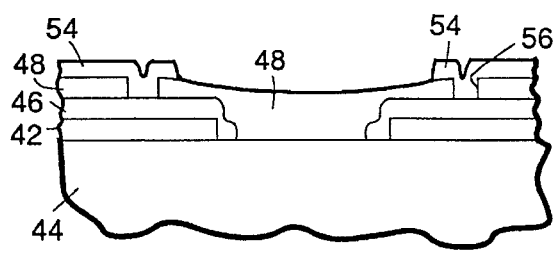
Figure 2F:
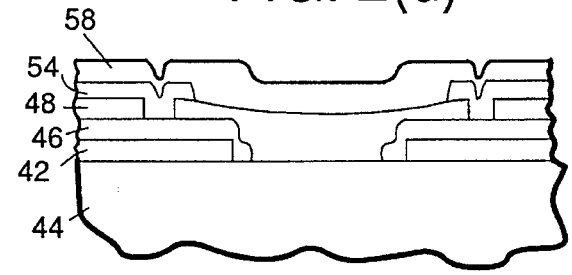

A first patterned metallization layer 54 is deposited overlying the flowable layer 48, numeral 28, as shown in FIG. 2(e). Procedures for depositing patterned metallization layers are well known and widely used in other contexts. Here, the metallization layer 54 is deposited by patterning the flowed dielectric layer 48, etching the flowed patterned dielectric layer to open vias 56 therethrough to the underlying polysilicon layer 46 in the illustrated case, and depositing the metallization layer 54. Patterning and etching are well known, and the metallization layer 54 can be deposited by any known technique such as electron beam evaporation. The metallization layer may be any operable electrical conductor suitable for the purpose, such as aluminum.

In interlevel dielectric (ILD) layer 58 is deposited overlying the previously defined structure, numeral 30. The interlevel dielectric layer 58 is preferably silicon dioxide, deposited by any operable technique such as chemical vapor deposition. The interlevel dielectric layer 58, shown in FIG. 2(f), also follows the surface contours of the underlying structure.

Figure 2G:
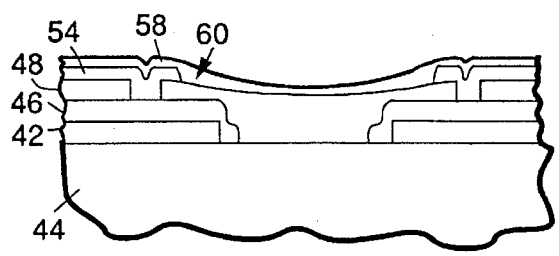

The interlevel dielectric layer 58 is etched back, numeral 92 and see FIG. 2(g). The etching is preferably conducted by a dry etch process such as a plasma etch. The etch back smoothes the contour at the edges of the steps, as indicated at numeral 60, in the first metallization layer 54.

Figure 2H:
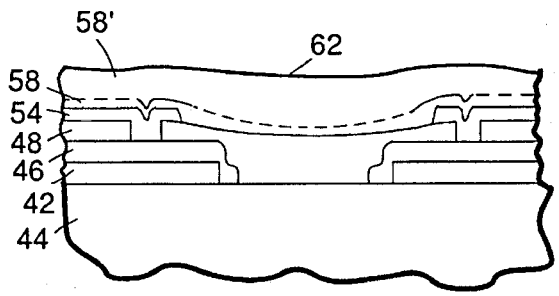
Figure 2I:
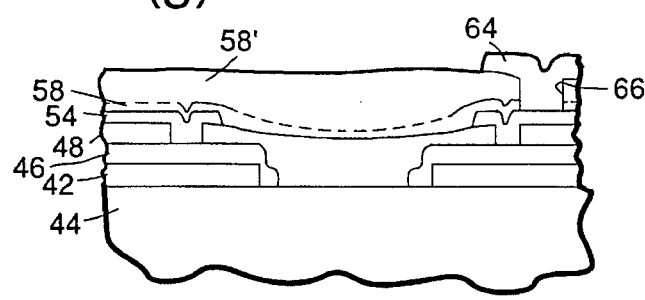

Additional interlevel dielectric material 58' may operationally be deposited overlying the etched interlevel dielectric material 58, numeral 94. If the interlevel dielectric layer 58 is not thinned too much in process step 32, then additional interlevel dielectric material 58' may not be needed. (The remainder of FIG. 2, FIGS. 2(h) and 2(i), are drawn with the additional interlevel dielectric material 58' added, process step 34. If step 34 is omitted, the layer 58' would be omitted from these figures.)

The interlevel dielectric material 58', when present, is preferably the same material as the dielectric material 58, silicon dioxide in this case. In FIG. 2(h), the boundary between the material 58 and the material 58' is indicated by a dashed line, to indicate that the two layers were deposited at different times. In practice, however, the layers 58 and 58' become a single interlevel dielectric layer. This combined layer has a smoother upper surface 62 than the corresponding upper surface in FIG. 2(f), due to the smoothing of the contours due to the etch back.

A second patterned metallization layer 64 is deposited overlying the upper surface 62 of the interlevel dielectric layer 58/58'. Deposition is accomplished in a manner similar to the deposition of the first metallization layer 54, by patterning the interlevel dielectric layer 58/58', etching the flowed patterned dielectric layer to open vias 66 therethrough to the underlying metallization layer 54 in the illustrated case, and depositing the second metallization layer 64. Patterning and etching are well known, and the second metallization layer 64 can be deposited by any known technique such as electron beam evaporation. As with the metallization layer 54, the metallization layer 64 may be made of any operable material.

The resulting structure, as shown in FIG. 2(*i*), is the final product of this portion of the processing. Additional layers, devices, traces, etc. can be added as desired. More metallization layers can also be added by repeating some or all of the preceding steps.

The process of the invention has been reduced to practice using the steps of FIG. 1 and the approach and materials described above, and producing the structure such as shown in FIG. 2. In this process, the topography thickness D was about 0.65 micrometers; the BPSG layer 48 was initially 1.5 micrometers thick; the BPSG layer 48 was 0.9 micrometers thick after etching; the first metallization layer 54 was 0.55 micrometers thick; the interlevel dielectric layer 58 was initially 1.0 micrometers thick prior to etchback, about 0.2 micrometers thick after etchback, and 0.6 micrometers after adding about 0.4 micrometers of the additional material 58'; and the second metallization layer was about 0.85 micrometers thick. A well-defined structure was obtained, without discontinuities or other defects that could inhibit operation of the microelectronic device.

Although a particular embodiment of the invention has been described in detail for purposes of illustration, various modifications may be made without departing from the spirit and scope of the invention. Accordingly, the invention is not to be limited except as by the appended claims.

What is claimed is:

1. A process for depositing a multilevel metallization interconnect structure in a microelectronic device, comprising the steps of:

providing a microelectronic device base structure having a predetermined topography thickness;

depositing a flowable dielectric layer having a thickness of from about two to about three times said topography thickness, whereby an uneven layer is formed;

flowing the uneven flowable dielectric layer to smooth said uneven layer;

thinning the smoothed flowable dielectric layer by etching to decrease the thickness thereof to a predetermined thickness; opening a via through the thinned, smooth flowable dielectric layer to the microelectronic device base structure;

depositing a first patterned metallization layer to overlie the via through the smoothed flowable dielectric layer;

depositing an interlevel dielectric layer;

thinning the interlevel dielectric layer by etching to smooth the surface thereof;

opening a via through the smoothed interlevel dielectric layer to the first patterned metallization layer; and depositing a second patterned metallization layer to overlie the via through the smoothed interlevel dielectric layer.

2. The process of claim 1, further including the additional step, after the step of thinning the interlevel dielectric layer and before the step of depositing a second patterned metallization layer, of depositing additional interlevel dielectric layer material.

3. The process of claim 1, wherein the step of depositing a flowable dielectric layer includes the step of depositing a flowable glass.

4. The process of claim 1, wherein the step of depositing a flowable dielectric layer includes the step of depositing a flowable borophosphosilicate glass.

5. The process of claim 1, wherein the step of flowing the flowable dielectric layer includes the step of heating the flowable dielectric layer to a temperature above its glass transition temperature.

6. The process of claim 1, wherein the step of thinning the flowable dielectric layer includes the step of blanket etching back the flowable dielectric layer without patterning the flowable dielectric layer.

7. The process of claim 1, wherein the step of depositing an interlevel dielectric layer includes the step of depositing an interlevel dielectric layer of an oxide insulator.

8. The process of claim 1, wherein the step of depositing an interlevel dielectric layer includes the step of depositing an interlevel dielectric layer of silicon dioxide.

9. The process of claim 1, wherein the step of thinning the interlevel dielectric layer includes the step of dry etching the interlevel dielectric layer.

10. The process of claim 1, wherein the step of thinning the interlevel dielectric layer includes the step of plasma etching the interlevel dielectric layer.

11. The process of claim 1, wherein the step of depositing a first patterned metallization layer includes the steps of patterning the flowed dielectric layer, etching the flowed dielectric layer, and depositing the first metallization layer.

12. The process of claim 1, wherein the step of depositing a second patterned metallization layer includes the steps of patterning the interlevel dielectric layer, etching the interlevel dielectric layer, and depositing the second metallization layer.

\* \* \* \* \*